(12) United States Patent
Doellgast et al.

(10) Patent No.: US 11,251,358 B2
(45) Date of Patent: Feb. 15, 2022

(54) HOLDER FOR A PIEZOELECTRIC COMPONENT

(71) Applicant: EPCOS AG, Munich (DE)

(72) Inventors: Bernhard Doellgast, Deutschlandsberg (AT); Markus Puff, Graz (AT); Pavol Kudela, Deutschlandsberg (AT)

(73) Assignee: EPCOS AG, Munich (DE)

( * ) Notice: Subject to any disclaimer, the term of this patent is extended or adjusted under 35 U.S.C. 154(b) by 838 days.

(21) Appl. No.: 15/746,763

(22) PCT Filed: Jun. 27, 2016

(86) PCT No.: PCT/EP2016/064833

§ 371 (c)(1),
(2) Date: Jan. 22, 2018

(87) PCT Pub. No.: WO2017/012827

PCT Pub. Date: Jan. 26, 2017

(65) Prior Publication Data

US 2018/0212138 A1 Jul. 26, 2018

(30) Foreign Application Priority Data

Jul. 23, 2015 (DE) .......................... 102015112044.5

(51) Int. Cl.
*H01L 41/047* (2006.01)
*H01L 41/053* (2006.01)
(Continued)

(52) U.S. Cl.
CPC .......... *H01L 41/0475* (2013.01); *H01L 23/32* (2013.01); *H01L 41/053* (2013.01); *H01L 41/107* (2013.01); *H01L 41/187* (2013.01)

(58) Field of Classification Search
CPC ... H01L 41/0475; H01L 23/32; H01L 41/187; H01L 41/053; H01L 41/107
(Continued)

(56) References Cited

U.S. PATENT DOCUMENTS 6,411,018 B1 * 6/2002 Heinz ................. H01L 41/0472
310/363
7,245,062 B2 * 7/2007 Schmidt ............. H01L 41/1136
290/1 R
(Continued)

FOREIGN PATENT DOCUMENTS

DE 2626708 A1 1/1977
DE 102005036077 A1 4/2007
(Continued)

OTHER PUBLICATIONS

Received STIC search report from EIC 2800 searcher Scott Segal dated May 11, 2020. (Year: 2020).*
(Continued)

*Primary Examiner* — Emily P Pham
*Assistant Examiner* — Htet Z Kyaw
(74) *Attorney, Agent, or Firm* — Morgan, Lewis & Bockius LLP

(57) ABSTRACT

The present invention relates to a holder (5) for a piezoelectric component (1), having a clamping device (6) and two contact elements (8) which contain a conductive rubber material, wherein the clamping device (6) is designed to clamp the piezoelectric component (1) between the contact elements (8) in a closed state, and wherein the contact elements (8) are in electrical contact with the piezoelectric component (1) in the closed state of the clamping device (6).

14 Claims, 2 Drawing Sheets

(51) Int. Cl.
*H01L 41/107* (2006.01)
*H01L 23/32* (2006.01)
*H01L 41/187* (2006.01)

(58) Field of Classification Search
USPC .......................................................... 310/318
See application file for complete search history.

(56) References Cited

U.S. PATENT DOCUMENTS

| | | | |
|---|---|---|---|
| 2001/0033123 A1* | 10/2001 | Thanner | H03H 9/09 |
| | | | 310/321 |
| 2009/0015099 A1 | 1/2009 | Mukae | |
| 2009/0146535 A1 | 6/2009 | Machida et al. | |
| 2009/0224631 A1 | 9/2009 | Mukae | |
| 2010/0135698 A1 | 6/2010 | Nemoto | |
| 2017/0214205 A1* | 7/2017 | Vergossen | H01M 50/502 |

FOREIGN PATENT DOCUMENTS

| | | |
|---|---|---|
| DE | 102008025028 A1 | 12/2009 |
| DE | 102010055266 A1 | 6/2012 |
| JP | H1074992 A | 3/1998 |
| JP | H1131856 A | 2/1999 |
| JP | 2001-267647 A | 9/2001 |
| JP | 2008-041737 A | 2/2008 |
| JP | 2008-053405 A | 3/2008 |
| JP | 2009141076 A | 6/2009 |
| JP | 2010158149 A | 7/2010 |
| JP | 2010190285 A | 9/2010 |

OTHER PUBLICATIONS

STIC search report from EIC 2800 searcher Steve Chung, Chickasaw for claim 1 dated Mar. 1, 2021. (Year: 2021).*
NPL search history for claims 1 and 9 with IP.com. (Year: 2021).*
Received search report from EIC 2800 searcher Samir Patel for claim 1 dated Jul. 29, 2021. (Year: 2021).*
Received search report from EIC 2800 searcher Samir Patel for claim 12 dated Jul. 30, 2021. (Year: 2021).*
Received the attached interview agenda or a proposed claim amendment from applicant's representative Karen Laub on Sep. 9, 2021. (Year: 2021).*

* cited by examiner

HOLDER FOR A PIEZOELECTRIC COMPONENT

The present invention relates to a holder for a piezoelectric component. The holder can be in particular a holder which is suitable for the mechanical suspension and electrical contacting of a piezoelectric component.

DE 2626708 A1 discloses securing an oscillating crystal with the aid of fork-shaped holding elements which are soldered to the oscillating crystal. A disadvantage of this solution, however, consists in that the oscillating crystal cannot be dismantled.

The object of the present invention is to provide an improved holder for a piezoelectric component.

This object is achieved by the subject matter of the present claim 1.

A holder for a piezoelectric component is proposed, which has a clamping device and two contact elements, wherein the contact elements contain a conductive rubber material. In particular, the contact elements can be made of the conductive rubber material. The clamping device is furthermore designed to clamp the piezoelectric component between the contact elements in a closed state, wherein the contact elements are in electrical contact with the piezoelectric component in the closed state of the clamping device.

By clamping the piezoelectric component between the contact elements, the piezoelectric component can be secured mechanically. Therefore, in a simple manner, the holder enables electrical contacting and mechanical securing of the piezoelectric component.

The holder can be designed such that the contact elements abut directly against the piezoelectric component in the closed state of the clamping device. The contact elements here can abut against an outer metallization of the piezoelectric component and thereby supply the piezoelectric component with an electrical voltage. The outer metallization can be for example an outer electrode of the component.

Preferably, no friction can be produced between the contact element and an outer face of the piezoelectric component when the piezoelectric component is clamped between the contacts.

The conductive rubber material furthermore acts as a damper owing to its elastic properties. Owing to the elastic properties of the conductive rubber material, mechanical oscillations of the piezoelectric component clamped between the contact elements are not transmitted to the further elements of the holder. Accordingly, the contact element can provide for a mechanical decoupling of the piezoelectric component and the holder. It can thus be ensured that the holder does not influence the oscillation of the piezoelectric component. It is thereby possible in particular to construct a holder which does not have a negative effect on the mode of operation of the piezoelectric component held thereby and does not interfere with said piezoelectric component.

Mechanical abrasion cannot occur between the contact element, which contains a conductive material, and the piezoelectric component. It can thus be ensured that a piezoelectric component which remains clamped in the clamping device for a long time is also unaltered in terms of its contact properties and its oscillating behavior.

With the clamping by means of the contact elements, it is possible to prevent uncontrolled mechanical stresses from arising. These could otherwise damage the piezoelectric component and lead for example to fractures in the piezoelectric component. Such uncontrolled mechanical stresses could otherwise also excite disharmonious oscillations, which is, however, prevented by the elastic contact elements.

The holder can be designed such that there is no soldered connection between the piezoelectric component and elements of the holder. Furthermore, the holder can be designed such that no permanent metallic connection is provided between the clamping device and the piezoelectric component. Instead, the piezoelectric component can be held by a clamping force which acts on the piezoelectric component via the contact elements. It is thereby possible to avoid the presence of metallic connections and solder joints which could form mechanical weak points of the holder. In particular, there is a risk of a metallic connection or solder joint fracturing in the event of a repeated load in which the piezoelectric component undergoes a plurality of oscillating cycles. This risk of fracture can be avoided by realizing the securing action using a clamping force. The clamping force can be strong enough to enable the piezoelectric component to be fixed reliably in place.

Owing to the elasticity of the contact element, it is possible to avoid a groove being pressed into the piezoelectric component as a result of the clamping force. As with mechanical abrasion, this would similarly have a negative influence on the properties of the piezoelectric component.

The clamping device can be releasable and have an open state in which the piezoelectric component can be removed from the holder. In particular, the piezoelectric component can be removed from the holder without interference. Accordingly, the component can be removed without the component or the holder thereby being damaged. A releasable clamping device can therefore enable the piezoelectric component to be changed.

The clamping device can be for example a snap clamping mechanism. The clamping device can be designed such that it enables simple assembly and dismantling of the piezoelectric component in the holder. In contrast to the holders in which the component is fixedly soldered to the holder, the holder here can therefore enable a damaged piezoelectric component to be changed and replaced with another piezoelectric component. It can thus be achieved that, in the event of a failure of the piezoelectric component, only this has to be changed and the other components can continue to be used.

The clamping device can have two arms between which the piezoelectric component is clamped in the closed state. Alternatively, the clamping device can have one arm, wherein the piezoelectric component is clamped between the arm and a printed circuit board in the closed state. In the second case, the contact element can abut directly against conductor tracks formed on the printed circuit board and the piezoelectric component can be in direct electrical contact with the conductor tracks of the printed circuit board.

The holder can furthermore have a connector element, wherein the connector element is clamped between the clamping device and one of the contact elements in the closed state of the clamping device and wherein the connector element is in electrical contact with the contact element. In particular, the holder can have two connector elements, wherein each of the connector elements is clamped between the clamping device and one of the contact elements in the closed state and wherein each of the connector elements is in electrical contact with one of the contact elements in each case. The connector elements can be for example a metal wire. The contact element can provide for a mechanical coupling between the metal wires and the piezoelectric component.

Since the contact element, which contains a conductive rubber material, is arranged between the connector element and the outer side of the piezoelectric component, the metal connector element is prevented from coming into direct mechanical contact with the piezoelectric component and damaging the latter during continuous operation, for example as a result of mechanical abrasion or through the impression of a groove.

The holder can have housing, wherein at least one arm is formed by the housing of the holder. The arm can be formed in particular by a housing part which can be releasably secured to a further housing part. The holder can be designed such that the clamping device is transferred into the open state when the housing is opened. When the housing is opened, the housing part which forms the arm is released from the further housing part.

The clamping device can be designed such that both arms of the clamping device are formed by a housing part of the holder.

It is thus possible to construct the clamping device such that it does not require any additional components since at least one arm is formed by the constantly present housing.

The holder can be designed such that it holds the piezoelectric component in a self-supporting manner. Accordingly, in addition to the elements of the holder, in particular the clamping device, no further components are required for securing the piezoelectric component mechanically.

The piezoelectric component here can be directly contacted mechanically only at the points at which the contact elements, which contain a conductive rubber material or are made of a conductive rubber material, abut directly against the piezoelectric component.

The conductive rubber material can be a silicone rubber with added metal particles. For example, it can be a silicone based elastomer to which graphite or silver particles are added. The added metal particles here can ensure that the contact element is conductive.

The size and shape of the contact element here depend on the design of the piezoelectric component to be held. The contact element can be for example disk shaped or square.

A further aspect relates to an arrangement which has a holder described above and a piezoelectric component.

The piezoelectric component can be for example a piezoelectric transformer. The piezoelectric component can be a multilayer component. The piezoelectric component can have a stack in which piezoelectric layers and inner electrodes are alternately arranged. The piezoelectric component can furthermore have, on its outer sides, an outer electrode which abuts against the contact elements in the closed state of the clamping device. Accordingly, an electrical voltage can be transmitted to the outer electrodes via the contact elements. The outer electrode can furthermore be in electrical contact with the inner electrodes.

The clamping device can be arranged such that contact elements of the piezoelectric component are secured mechanically and contacted electrically in a region in which an oscillation node forms during operation of the piezoelectric component at its resonant frequency. Accordingly, in the region of the oscillation node, the piezoelectric component moves only minimally during operation. Accordingly, considerably lower mechanical loads are produced here than in the regions in which oscillation antinodes form. The resonant frequency is determined by the geometry of the piezoelectric component. It can be between 10 and 1000 kHz. The resonant frequency can preferably be between 20 and 100 kHz, and for example 50 kHz.

The invention is described below with reference to the figures and exemplary embodiments.

FIG. 1 shows a piezoelectric component 1. The piezoelectric component 1 is a piezoelectric transformer.

Figure 1:
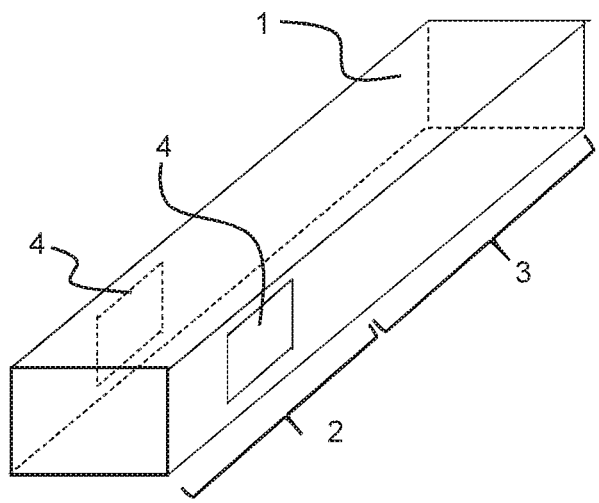
FIG. 1 shows a schematic view of a piezoelectric component.

The piezoelectric component 1 has an input side 2 and an output side 3. On the input side 2, the component 1 has a multilayer structure in which piezoelectric layers and first and second inner electrodes arranged between them are stacked on top of one another. The piezoelectric layers contain a lead zirconate titanate (PZT) ceramic material. On the input side 2, the piezoelectric layers are polarized in the stack direction. The inner electrodes are made of copper.

In a stack direction, a first inner electrode and a second inner electrode are arranged alternately here between two piezoelectric layers in each case. The first inner electrodes are led out at a first outer side of the piezoelectric component 1 and are spaced from a second outer side. The second inner electrodes are spaced from the first outer side and are led out at the second outer side. Furthermore arranged on the first outer side and the second outside side are outer electrodes 4 in each case, which are in electrical contact with the inner electrodes leading out at the respective outer side.

The outer electrodes 4 on the first and the second outer face are arranged in a node point here, which forms during operation of the piezoelectric component 1 at its resonance frequency or during operation of the component 1 in the second harmonic oscillation. The node point can be arranged in the longitudinal direction at a quarter of the length of the piezoelectric component 1. As described below, a holder 5 is designed to secure the piezoelectric component 1 mechanically at this node point.

On the output side 3, the piezoelectric component 1 has a monolithic structure. In particular, the output side 3 contains the same piezoelectric material as the input side 2. The output side 3 of the piezoelectric component 1 is polarized in the longitudinal direction. An end face of the piezoelectric component 1 which is arranged on the output side 3 is furthermore metallized.

During operation of the piezoelectric component 1, an alternating voltage is applied at the outer electrodes 4 on the input side 2, which alternating voltage excites the piezoelectric oscillations in the stack direction between the inner electrodes. A wave can thus form, which continues in the longitudinal direction. It is thereby possible to generate a high voltage at the metallized end face on the output side 3. By means of this high voltage, a gas, for example air, can be ionized and atmospheric, non-thermal plasma can thereby be generated.

During its operation, the piezoelectric component 1 executes oscillations which are associated with changes in length of the piezoelectric component 1.

Figure 2:
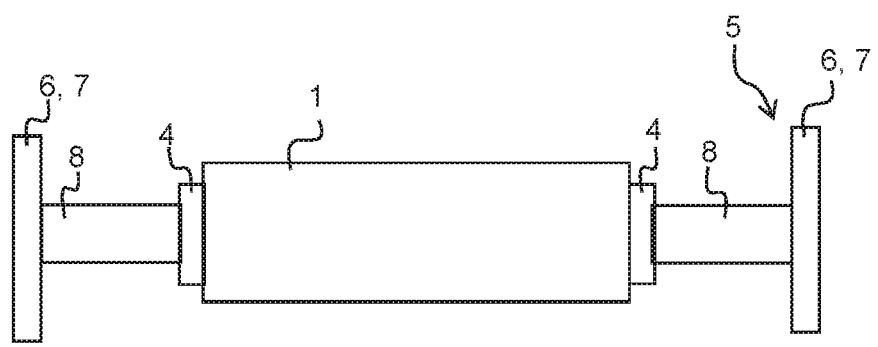
FIG. 2 shows a cross-section through a holder according to a first exemplary embodiment, wherein a piezoelectric component is held in the holder, FIG. 3 likewise shows the holder according to the first exemplary embodiment.
Figure 3:
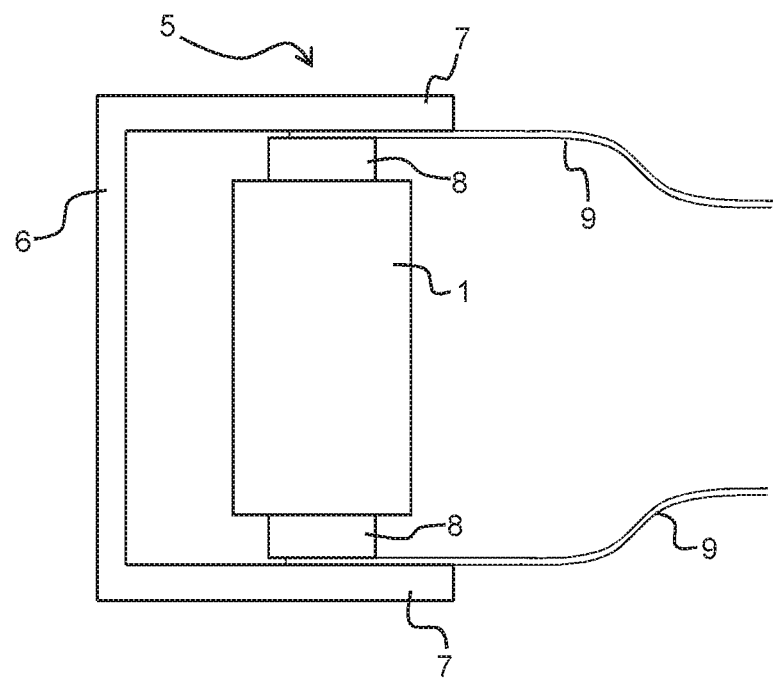

FIGS. 2 and 3 each show a holder 5 for the piezoelectric component 1 in a cross-section. The holder 5 has a clamping device 6. The clamping device 6 has two arms 7. The arms 7 of the clamping device 6 here are formed by housing parts of the holder 5.

The clamping device 6 furthermore has two contact elements 8. The contact elements 8 are clamped with the piezoelectric component 1 in a closed state of the clamping device 6. The piezoelectric component 1 is thus secured mechanically.

A first contact element 8 here abuts against the outer electrode 4 of the piezoelectric component 1 at the first outer face and the second contact element 8 abuts against the outer electrode 4 of the piezoelectric component 1 at the second outer side. The contact elements 8 contain a conductive rubber material. Accordingly, the contact elements 8 enable an electrical voltage to be transmitted to the outer electrodes 4 of the piezoelectric component 1.

The holder 5 furthermore has connector elements 9. The connector elements 9 are wires. A first connector element 9 is clamped between the first arm 7 of the clamping device 6 and the first contact element 8. A second connector element 9 is clamped between the second arm 7 of the clamping device 6 and the second contact element 8. The connector elements 9 enable further contacting and can, for example, connect the contact elements 8 electrically to a circuit which is formed on a printed circuit board.

If a housing of the holder 5 is opened, the clamping device 6 is thus released and transferred from its closed state into an open state. In the open state, the clamping device 6 no longer holds the piezoelectric component 1 and it can be removed from the holder 5.

The piezoelectric component 1 is secured in the holder 5 in a self-supporting manner. It is held only by the clamping force exerted on the component 1 by the clamping device 6 via the contact elements 8. In particular, the component 1 touches only the two contact elements 8 and is otherwise not touched by a further element of the holder 5.

In an alternative exemplary embodiment, further holding elements, which secure the piezoelectric component mechanically, can be arranged in one or more further oscillation nodes of the piezoelectric component 1. These further holding elements can likewise have a clamping device, for example. However, the further holding elements are not provided or formed for the transmission of electrical energy.

Figure 4:
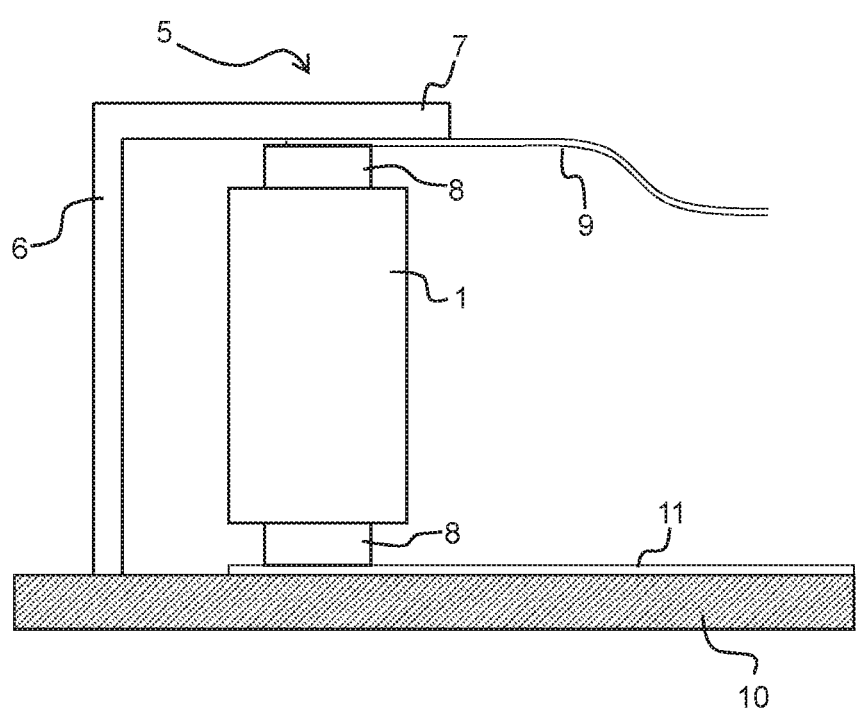
FIG. 4 shows a second exemplary embodiment of the holder.

FIG. 4 shows a second exemplary embodiment of the holder 5. The second exemplary embodiment differs from the first exemplary embodiment in that the clamping device 6 has only one arm 7. The piezoelectric component 1 is clamped between this arm 7 and a printed circuit board 10 in the closed state of the clamping device 6, wherein a contact element 8, which contains a conductive rubber material, is arranged in each case between the arm 7 and the piezoelectric component 1 and between the printed circuit board 10 and the piezoelectric component 1. The contact element 8 can abut directly against a conductor track 11 of the printed circuit board 10 here and the piezoelectric element 1 can therefore be in contact with the circuit formed on the printed circuit board 10. The first arm 7 of the clamping device 6 can in turn be formed by a housing part so that the clamping device 6 is released when the housing is opened.

LIST OF REFERENCE SIGNS

1 piezoelectric component
2 input side
3 output side
4 outer electrode
5 holder
6 clamping device
7 arm
8 contact element
9 connector element
10 printed circuit board
11 conductor track

The invention claimed is:

1. A holder for a piezoelectric component, having a clamping device and two contact elements which contain a conductive rubber material, wherein the clamping device is designed to clamp the piezoelectric component between the two contact elements in a closed state of the clamping device, and wherein the two contact elements are in electrical contact with the piezoelectric component in the closed state of the clamping device,
   wherein the holder has a connector element clamped between the clamping device and one of the two contact elements in the closed state of the clamping device, wherein the connector element is a wire and is in electrical contact with the one of the two contact elements, and wherein there is no solder connection and no permanent metallic connection between the piezoelectric component and the two contact elements of the holder.

2. The holder according to claim 1,
   wherein the clamping device is releasable and has an open state of the clamping device in which the piezoelectric component can be removed from the holder.

3. The holder according to claim 1,
   wherein the clamping device has two arms between which the piezoelectric component is clamped in the closed state of the clamping device.

4. The holder according to claim 3,
   wherein the holder has a housing,
   wherein at least one arm is formed by the housing of the holder, and wherein the holder is designed such that the clamping device is transferred into an open state of the clamping device when the housing is opened.

5. The holder according to claim 1,
   wherein the clamping device has one arm, wherein the piezoelectric component is clamped between the arm and a printed circuit board in the closed state of the clamping device.

6. The holder according to claim 1,
   wherein the holder is designed to hold the piezoelectric component in a self-supporting manner.

7. The holder according to claim 1,
   wherein the conductive rubber material is a silicone rubber with added metal particles.

8. The holder according to claim 1,
   wherein the holder has a second connector element clamped between the clamping device and a second contact element of the two contact elements in the closed state of the clamping device, and wherein the second connector element is a wire and is in electrical contact with the second contact element of the two contact elements.

9. An arrangement having a holder and a piezoelectric component, the holder has a clamping device and two contact elements which contain a conductive rubber material, and the clamping device is designed to clamp the piezoelectric component between the two contact elements in a closed state of the clamping device, and the two contact elements are in electrical contact with the piezoelectric component in the closed state of the clamping device,
   wherein the holder has a connector element clamped between the clamping device and one of the two contact elements in the closed state of the clamping device, wherein the connector element is a wire and is in electrical contact with the one of the two contact elements, and wherein there is no solder connection and no permanent metallic connection between the piezoelectric component and the two contact elements of the holder.

10. The arrangement according to claim 9, wherein the clamping device is arranged such that the two contact elements secure the piezoelectric component mechanically and are in electrical contact therewith in a region in which an oscillation node forms during operation of the piezoelectric component at its resonant frequency.

11. The arrangement according to claim 9, wherein the piezoelectric component is a piezoelectric transformer.

12. The arrangement according to claim 9, wherein the holder has a second connector element clamped between the clamping device and a second contact element of the two contact elements in the closed state of the clamping device, and wherein the second connector element is a wire and is in electrical contact with the second contact element of the two contact elements.

13. A holder for a piezoelectric component, having a clamping device and two contact elements which contain a conductive rubber material, wherein the clamping device is designed to clamp the piezoelectric component between the two contact elements in a closed state of the clamping device, and wherein the two contact elements are in electrical contact with the piezoelectric component in the closed state of the clamping device,
wherein the holder has a connector element clamped between the clamping device and one of the two contact elements in the closed state of the clamping device, wherein the connector element is a wire and is in electrical contact with the one of the two contact elements, and wherein the conductive rubber material is a silicone based elastomer to which graphite or silver particles are added.

14. The holder according to claim 13, wherein the holder has a second connector element clamped between the clamping device and a second contact element of the two contact elements in the closed state of the clamping device, and wherein the second connector element is a wire and is in electrical contact with the second contact element of the two contact elements.

* * * * *